US009153927B2

(12) United States Patent
Nowak et al.

(10) Patent No.: US 9,153,927 B2
(45) Date of Patent: Oct. 6, 2015

(54) REGENERATIVE AMPLIFIER, LASER APPARATUS, AND EXTREME ULTRAVIOLET LIGHT GENERATION SYSTEM

(71) Applicant: GIGAPHOTON INC., Oyama-shi, Tochigi (JP)

(72) Inventors: Krzysztof Nowak, Oyama (JP); Takashi Suganuma, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/956,282

(22) Filed: Jul. 31, 2013

(65) Prior Publication Data

US 2013/0315272 A1    Nov. 28, 2013

Related U.S. Application Data

(63) Continuation of application No. 13/121,319, filed as application No. PCT/JP2011/055861 on Mar. 7, 2011, now Pat. No. 8,749,876.

(30) Foreign Application Priority Data

Mar. 15, 2010 (JP) ................. 2010-058512
Dec. 20, 2010 (JP) ................. 2010-283716

(51) Int. Cl.
*H01S 3/23* (2006.01)
*H01S 3/139* (2006.01)
(Continued)

(52) U.S. Cl.
CPC . *H01S 3/05* (2013.01); *B82Y 20/00* (2013.01); *H01S 3/22* (2013.01); *H01S 3/235* (2013.01);
(Continued)

(58) Field of Classification Search
CPC ....... H01S 3/08; H01S 3/08095; H01S 3/235; H01S 3/2232; H01S 3/2325; H01S 3/139; H01S 3/089095
USPC .................... 359/342, 348; 372/355
See application file for complete search history.

(56) References Cited

U.S. PATENT DOCUMENTS

| 5,386,431 A | 1/1995 | Tulip |
| 5,600,668 A | 2/1997 | Erichsen et al. |

(Continued)

FOREIGN PATENT DOCUMENTS

| EP | 2 043 205 A1 | 4/2009 |
| JP | 07-154018 A | 6/1995 |

(Continued)

OTHER PUBLICATIONS

Office Action Japanese Patent Application No. 2010-283716 dated Aug. 19, 2014 with English translation.

(Continued)

*Primary Examiner* — Eric Bolda
(74) *Attorney, Agent, or Firm* — Studebaker & Brackett PC

(57) ABSTRACT

A regenerative amplifier according to one aspect of this disclosure is used in combination with a laser device, and the regenerative amplifier may include: a pair of resonator mirrors constituting an optical resonator; a slab amplifier provided between the pair of the resonator mirrors for amplifying a laser beam with a predetermined wavelength outputted from the laser device; and an optical system disposed to configure a multipass optical path along which the laser beam is reciprocated inside the slab amplifier, the optical system transferring an optical image of the laser beam at a first position as an optical image of the laser beam at a second position.

13 Claims, 11 Drawing Sheets

(51) Int. Cl.
  *H01S 3/08* (2006.01)
  *H01S 3/05* (2006.01)
  *B82Y 20/00* (2011.01)
  *H01S 3/22* (2006.01)
  *H01S 5/042* (2006.01)
  *H01S 5/06* (2006.01)
  *H01S 3/03* (2006.01)
  *H01S 3/223* (2006.01)
  *H01S 5/14* (2006.01)
  *H01S 5/34* (2006.01)

(52) U.S. Cl.
  CPC ............... *H01S 3/2325* (2013.01); *H01S 5/042* (2013.01); *H01S 5/06* (2013.01); *H01S 3/0315* (2013.01); *H01S 3/08031* (2013.01); *H01S 3/139* (2013.01); *H01S 3/2232* (2013.01); *H01S 3/2366* (2013.01); *H01S 3/2375* (2013.01); *H01S 5/14* (2013.01); *H01S 5/3401* (2013.01)

(56) References Cited

U.S. PATENT DOCUMENTS

| | | | |
|---|---|---|---|
| 5,872,804 A | 2/1999 | Kan et al. | |
| 5,986,234 A * | 11/1999 | Matthews et al. | 219/121.68 |
| 6,373,866 B1 | 4/2002 | Black | |
| 6,421,363 B1 | 7/2002 | Osinski et al. | |
| 7,217,940 B2 | 5/2007 | Partlo et al. | |
| 7,327,769 B2 | 2/2008 | Henschke et al. | |
| 7,518,787 B2 | 4/2009 | Bykanov et al. | |
| 7,842,937 B2 | 11/2010 | Hoshino et al. | |
| 7,903,715 B2 | 3/2011 | Nowak et al. | |
| 8,000,361 B2 | 8/2011 | Abe et al. | |
| 8,749,876 B2 * | 6/2014 | Nowak et al. | 359/333 |
| 2003/0058915 A1 | 3/2003 | Kumkar | |
| 2003/0219054 A1 | 11/2003 | Capasso et al. | |
| 2006/0078017 A1 | 4/2006 | Endo et al. | |
| 2007/0001131 A1 | 1/2007 | Ershov et al. | |
| 2008/0013163 A1 | 1/2008 | Leonardo et al. | |
| 2008/0014862 A1 | 1/2008 | Van Buren et al. | |
| 2008/0198891 A1 | 8/2008 | Hori et al. | |
| 2008/0225908 A1 | 9/2008 | Ershov et al. | |
| 2009/0316746 A1 | 12/2009 | Nowak et al. | |
| 2010/0078577 A1 | 4/2010 | Moriya et al. | |
| 2010/0091359 A1 | 4/2010 | Yamamoto et al. | |
| 2010/0117009 A1 | 5/2010 | Moriya et al. | |
| 2010/0193710 A1 | 8/2010 | Wakabayashi et al. | |
| 2010/0195196 A1 | 8/2010 | Nowak et al. | |
| 2010/0220756 A1 | 9/2010 | Krzysztof et al. | |

FOREIGN PATENT DOCUMENTS

| | | |
|---|---|---|
| JP | 2001-007421 A | 1/2001 |
| JP | 2008-28316 A | 2/2008 |
| JP | 2008-270549 A | 11/2008 |
| JP | 2009-26854 | 2/2009 |
| JP | 2009-246345 A | 10/2009 |
| JP | 2010-3755 A | 1/2010 |
| JP | 2010-21518 A | 1/2010 |
| WO | 2011/115025 A1 | 9/2011 |

OTHER PUBLICATIONS

Alex Dergachev et al., "Review of Multipass Slab Laser Systems", IEEE Journal of Selected Topics in Quantum Electronics, vol. 13, No. 3, May/Jun. 2007, pp. 647-660.
International Search Report issued in International Patent Application No. PCT/JP2011/055861 dated Jul. 5, 2011 (form ISA/210).
Written Opinion of the International Searching Authority issued in International Patent Application No. PCT/JP2011/055861 (form ISA/237).
Notification Concerning Submission, Obtention or Transmittal of Priority Document issued in International Patent Application No. PCT/JP2011/055861 dated Apr. 27, 2011.
Dergachev, A. et al, "Review of Multipass Slab Laser Systems". IEEE Journal of Selected Topics in Quantum Electronics. vol. 13, No. 3, May/Jun. 2007.

* cited by examiner

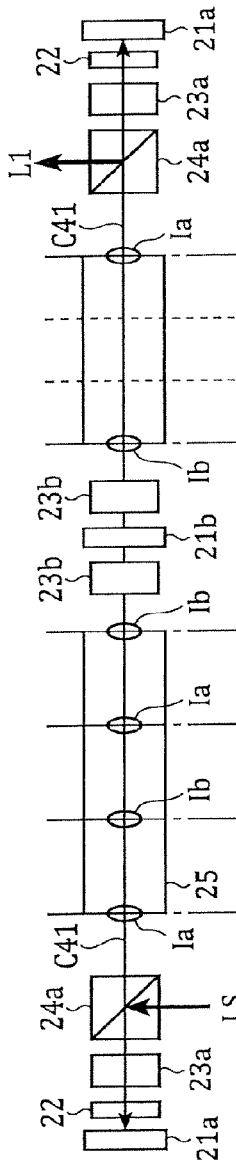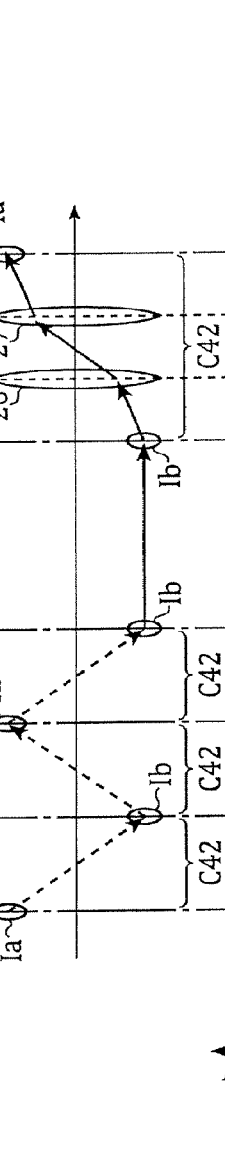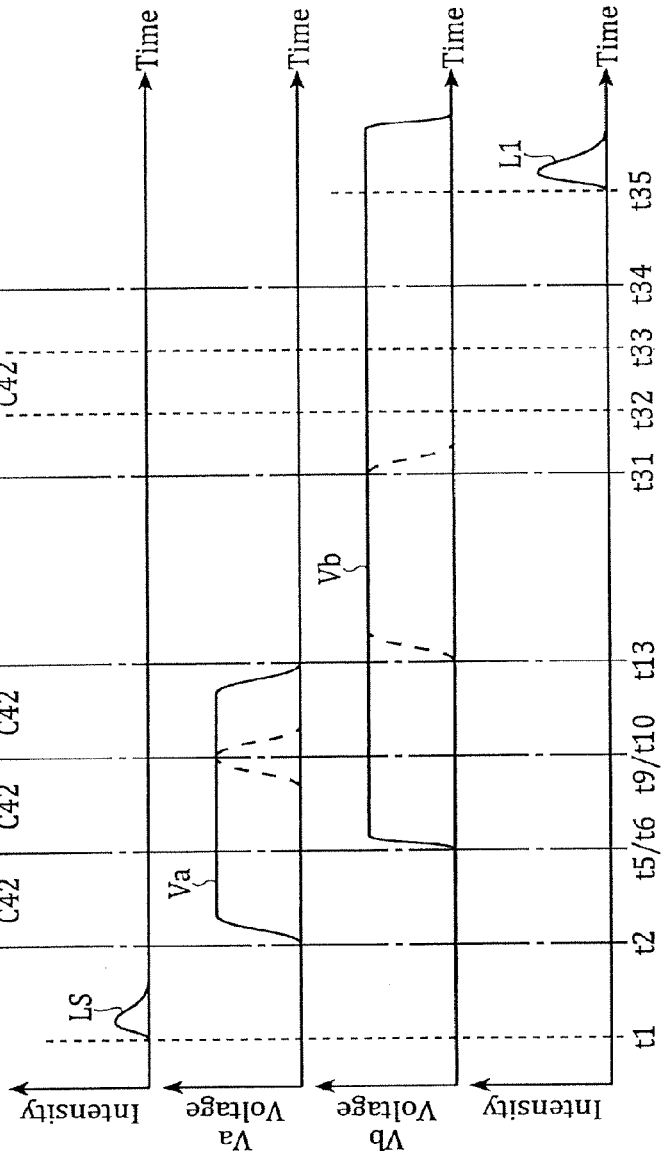
FIG. 14A
FIG. 14B
FIG. 14C
FIG. 14D
FIG. 14E
FIG. 14F

REGENERATIVE AMPLIFIER, LASER APPARATUS, AND EXTREME ULTRAVIOLET LIGHT GENERATION SYSTEM

RELATED APPLICATIONS

The application is a continuation of U.S. application Ser. No. 13/121,319 filed on Jul. 12, 2011 which is the U.S. National Phase under 35 U.S.C. §371 of International Application No. PCT/JP2011/055861, filed on Mar. 7, 2011, which in turn claims the benefit of Japanese Application No. 2010-058512, filed on Mar. 15, 2010 and Japanese Application No. 2010-283716, filed on Dec. 20, 2010, the disclosures of which Applications are incorporated by reference herein.

BACKGROUND

1. Technical Field

This disclosure relates to a regenerative amplifier, a laser apparatus, and an extreme ultraviolet light generation system.

2. Related Art

With recent increase in integration of semiconductor devices, transfer patterns for use in photolithography of a semiconductor process have rapidly become finer. In the next generation, microfabrication at 70 to 45 nm, further, microfabrication at 32 nm or less is to be demanded. Accordingly, for example, to meet the demand for microfabrication at 32 nm or less, an exposure apparatus is expected to be developed, where an extreme ultraviolet (EUV) light generation system generating EUV light of a wavelength of approximately 13 nm is combined with a reduction projection reflective optical system.

There are mainly three types of EUV light generation systems, namely, a laser produced plasma (LPP) type system using plasma produced by applying a laser beam onto a target, a discharge produced plasma (DPP) type system using plasma produced by discharge, and a synchrotron radiation type system using orbital radiation.

SUMMARY

A regenerative amplifier according to one aspect of this disclosure is used in combination with a laser device, and the regenerative amplifier may include: a pair of resonator mirrors constituting an optical resonator; a slab amplifier provided between the pair of the resonator mirrors for amplifying a laser beam with a predetermined wavelength outputted from the laser device; and an optical system disposed to configure a multipass optical path along which the laser beam is reciprocated inside the slab amplifier, the optical system transferring an optical image of the laser beam at a first position as an optical image of the laser beam at a second position.

A laser apparatus according to another aspect of this disclosure may include: at least one semiconductor laser oscillating a laser beam with a predetermined wavelength; and a regenerative amplifier including a pair of resonator mirrors constituting an optical resonator, an input coupling unit provided between the pair of the resonator mirrors for introducing the laser beam into the optical resonator, a slab amplifier provided between the pair of the resonator mirrors for amplifying the laser beam with the predetermined wavelength, an optical system disposed to configure a multipass optical path along which the laser beam is reciprocated inside the slab amplifier, the optical system transferring an optical image of the laser beam at a first position as an optical image of the laser beam at a second position, and an output coupling unit for outputting the laser beam amplified by the slab amplifier to an exterior of the optical resonator.

An extreme ultraviolet light generation system according to yet another aspect of this disclosure may include: at least one semiconductor laser oscillating a laser beam with a predetermined wavelength; a regenerative amplifier including a pair of resonator mirrors constituting an optical resonator, an input coupling unit provided between the pair of the resonator mirrors for introducing the laser beam into the optical resonator, a slab amplifier provided between the pair of the resonator mirrors for amplifying the laser beam with the predetermined wavelength, an optical system disposed to form a multipass optical path along which the laser beam is reciprocated inside the slab amplifier, the optical system transferring an optical image of the laser beam at a first position as an optical image of the laser beam at a second position, and an output coupling unit for outputting the laser beam amplified by the slab amplifier to an exterior of the optical resonator; at least one amplifier for amplifying the laser beam outputted from the regenerative amplifier; a chamber provided with an input port through which the laser beam enters the chamber; a target supply unit provided to the chamber for supplying, to a predetermined region inside the chamber, a target substance serving as a plasma source; a focusing mirror for focusing the laser beam amplified by the at least one amplifier at a point in the predetermined region; and a collector mirror provided in the chamber for collecting the extreme ultraviolet light emitted from the plasma generated in the predetermined region.

These and other objects, features, aspects, and advantages of this disclosure will become apparent to those skilled in the art from the following detailed description, which, taken in conjunction with the annexed drawings, discloses preferred embodiments of this disclosure.

BRIEF DESCRIPTION OF DRAWINGS

FIGS. 14A through 14F describe overall operation of the regenerative amplifier of the third embodiment.

DESCRIPTION OF PREFERRED EMBODIMENTS

Selected embodiments of this disclosure will be described in detail below with reference to the drawings. In the following description, each drawing merely schematically illustrates shape, size, and positional relationship to a degree that allows the contents of the disclosure to be understood, so that the disclosure is not limited by the shape, the size, and the positional relationship illustrated in each drawing. Further, indicated numerical values are merely preferable exemplary values in the disclosure, so that the disclosure is not limited by the indicated exemplary numerical values.

First Embodiment

Figure 1:
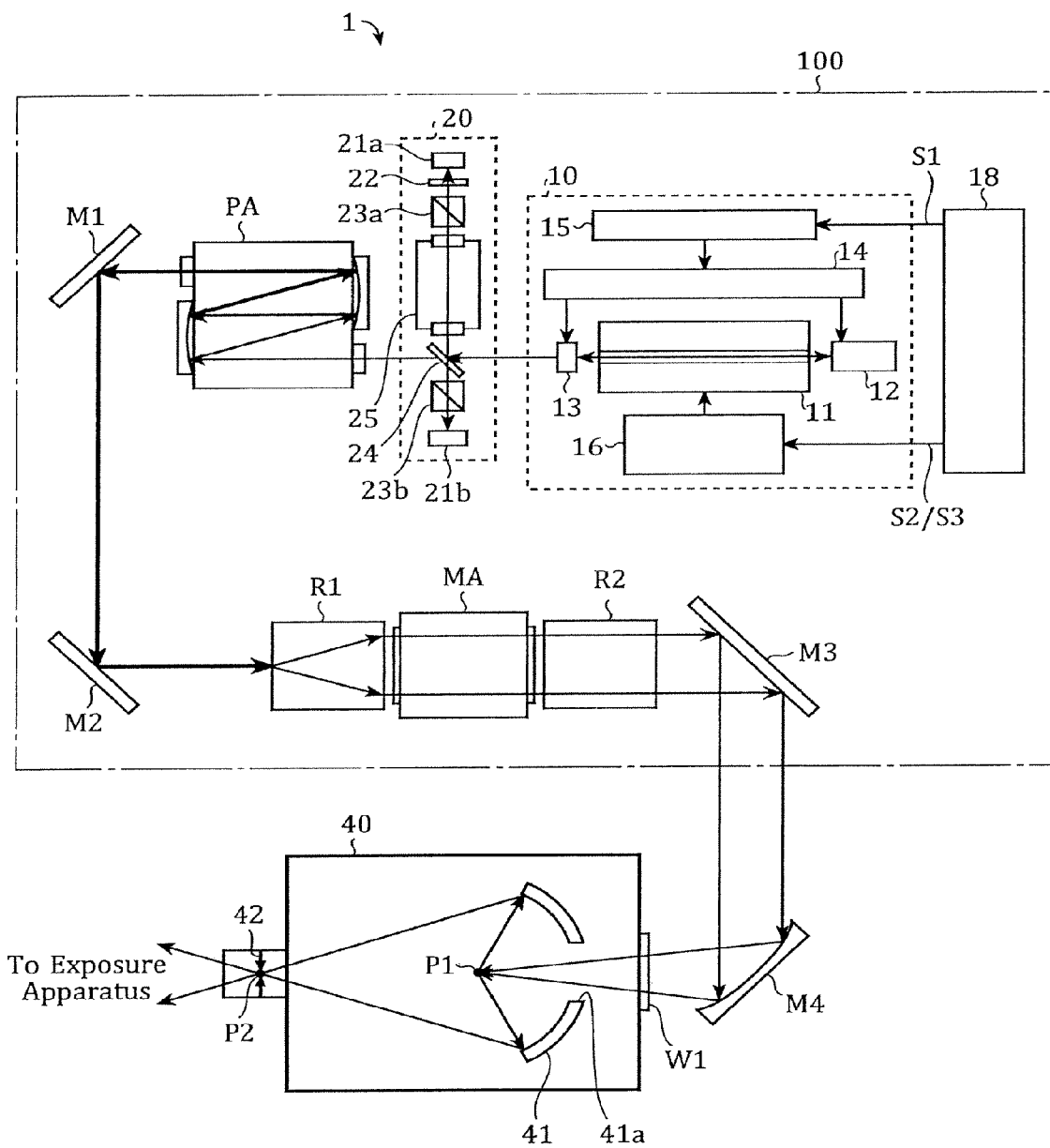
FIG. 1 illustrates a schematic configuration of an EUV light generation system according to a first embodiment of this disclosure.
Figure 2:
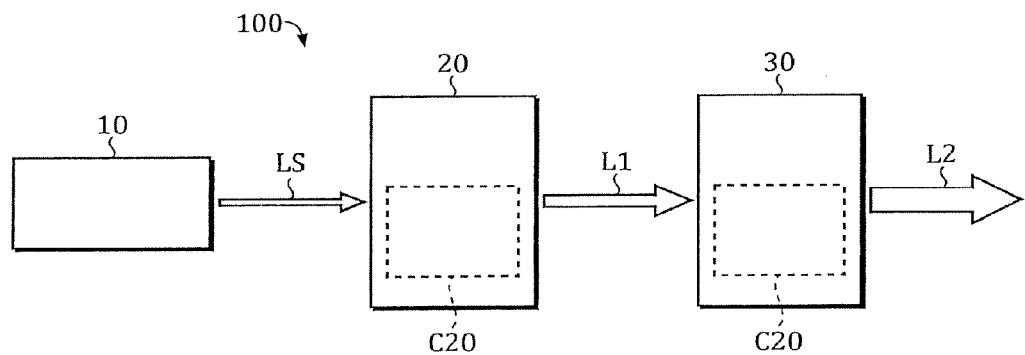
FIG. 2 illustrates a schematic configuration of a laser apparatus according to the first embodiment.
Figure 3:
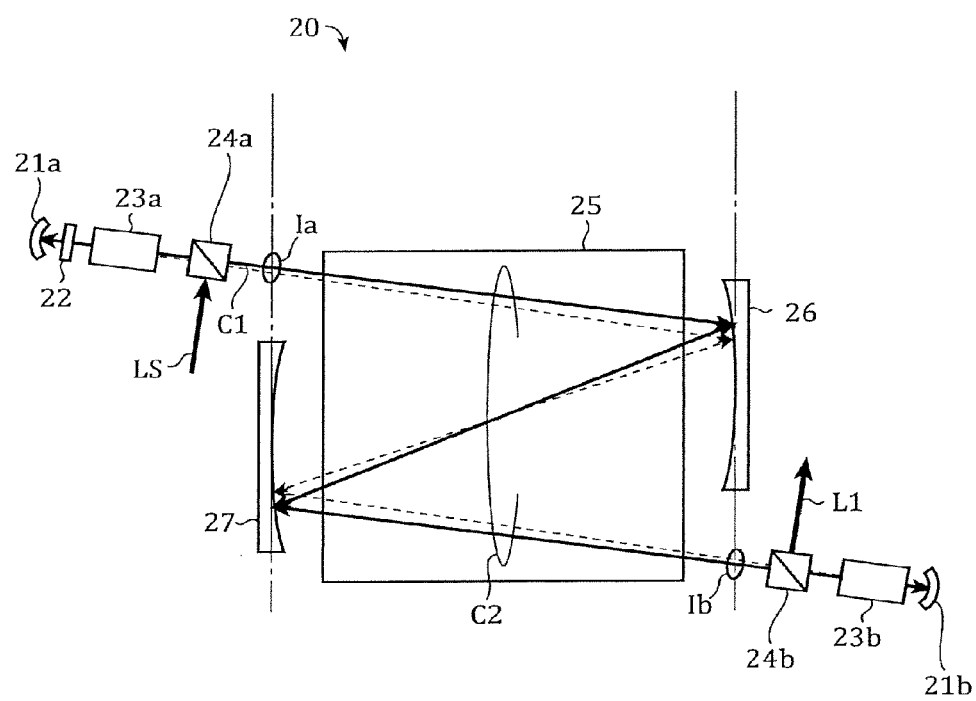
FIG. 3 illustrates a schematic configuration of a regenerative amplifier according to the first embodiment.

A regenerative amplifier, a laser apparatus, and an EUV light generation system according to a first embodiment of this disclosure will be described in detail below with reference to the drawings. FIG. 1 illustrates the schematic configuration of an EUV light generation system 1 of the first embodiment, FIG. 2 illustrates the schematic configuration of a laser apparatus 100 of the first embodiment, and FIG. 3 illustrates the schematic configuration of a regenerative amplifier 20 of the first embodiment.

As illustrated in FIG. 1, the EUV light generation system 1 of the first embodiment may include a semiconductor laser 10, a semiconductor laser controller 18, a regenerative amplifier 20, a pre-amplifier PA, high-reflection (HR) mirrors M1 and M2, a relay optical system R1, a main amplifier MA, a relay optical system R2, a high-reflection (HR) mirror M3, an off-axis paraboloidal mirror M4, and an EUV chamber 40. The semiconductor laser 10 may output a pulsed laser beam in a single-longitudinal mode or in a multi-longitudinal mode. The semiconductor laser controller 18 may control the oscillation wavelength of the semiconductor laser 10 and the pulse shape (including the pulse width) of a seed beam to be outputted from the semiconductor laser 10. The regenerative amplifier 20 may amplify the seed beam outputted from the semiconductor laser 10. The pre-amplifier PA may further amplify the amplified pulsed laser beam (hereinafter referred to as regenerative amplified pulsed laser beam). The HR mirrors M1 and M2 may guide the pulsed laser beam outputted from the pre-amplifier PA (hereinafter referred to as amplified pulsed laser beam) to the main amplifier MA. The relay optical system R1 may increase the diameter of the amplified pulsed laser beam entering the main amplifier MA such that the diameter substantially coincides with the width of a slab amplifier in the main amplifier MA. The main amplifier MA may further amplify the amplified pulsed laser beam, of which the diameter has been increased. The relay optical system R2 may collimate the amplified pulsed laser beam which has been amplified by the main amplifier MA. The HR mirror M3 may guide the collimated amplified pulsed laser beam to the off-axis paraboloidal mirror M4. The off-axis paraboloidal mirror M4 may reflect the collimated amplified pulsed laser beam such that the amplified pulsed laser beam is focused at a point in a predetermined region (plasma generation region P1) inside the EUV chamber 40. The EUV chamber 40 may include a target supply unit (not illustrated) for supplying, to the plasma generation region P1 where the amplified pulsed laser beam is focused, a droplet or a solid target serving as a source for generating EUV light.

The semiconductor laser 10 may include a semiconductor device 11, a rear optical module 12, an output coupling mirror 13, a longitudinal-mode control actuator 14, a longitudinal-mode controller 15, and a current control actuator 16. The semiconductor laser 10 may output a pulsed laser beam of a wavelength corresponding to an amplification line of the pre-amplifier PA and the main amplifier MA. The semiconductor laser 10 may oscillate a pulsed laser beam of a wavelength corresponding to one or more amplification lines of a $CO_2$-gas gain medium C20 to be used as a gain medium in the regenerative amplifier 20, the pre-amplifier PA, and the main amplifier MA provided downstream of the semiconductor laser 10. Such a semiconductor device may, for example, be configured of a quantum cascade laser (QCL).

The output coupling mirror 13 may be provided to a front side (also referred to as a beam lead-out side) of the semiconductor device 11, and the rear optical module 12 may be provided to a rear side of the semiconductor device 11. An optical resonator is configured of the output coupling mirror 13 and the rear optical module 12 which are arranged with the semiconductor device 11 being disposed therebetween. The longitudinal-mode controller 15 may drive the longitudinal-mode control actuator 14 in accordance with an oscillation wavelength signal S1 outputted from the semiconductor laser controller 18 so as to move at least one of the output coupling mirror 13 and the rear optical module 12, whereby the length of the optical resonator may be controlled.

The current control actuator 16 may control the waveform and the current (hereinafter simply referred to as current waveform) of a current signal to be inputted to the semiconductor device 11 in accordance with an oscillation pulse shape signal S2 and a control signal S3 outputted from the semiconductor laser controller 18. The semiconductor device 11 may oscillate a pulsed laser beam in accordance with the current waveform controlled by the current control actuator 16.

By thus using, in a master oscillator, the semiconductor device 11 of which the current can easily be controlled, the intensity and the pulse width of a pulsed laser beam outputted from the master oscillator can be controlled by the current waveform. Thus, a pulsed laser beam having desired intensity and a desired pulse width can be obtained easily. Particularly, the intensity, the pulse width, and so forth, of a pulsed laser beam outputted from the semiconductor laser 10 can be adjusted relatively freely by controlling the current control actuator 16 to adjust the current waveform inputted to the semiconductor device 11. As a result, a pulsed laser beam having desired intensity and a desired pulse width can be obtained easily without changing the configuration of the apparatus.

Next, the configuration of the regenerative amplifier 20 will be described below. The regenerative amplifier 20 may include resonator mirrors 21a and 21b, a slab amplifier 25, a polarizer 24a, Pockels cells (EOM) 23a and 23b, and a quarter-wave plate 22. Detailed functions and operation of the regenerative amplifier 20 will be described later. The regenerative amplifier 20 can efficiently amplify a low-intensity pulsed laser (seed) beam outputted from the semiconductor device 11. The pulsed laser beam amplified by the regenerative amplifier 20 may further be amplified by the pre-amplifier PA and the main amplifier MA. Then, the laser apparatus 100 may output a pulsed laser beam of such characteristics as follows. The pulsed laser beam has high pulse energy (approximately 50 to 200 mJ), a relatively short pulse width (10 to 100 ns), a high repetition rate (50 to 100 kHz), and a power of 10 to 20 kW. The pulsed laser beam outputted from the laser apparatus 100 may be reflected by the flat HR mirror M3, and be guided to the off-axis paraboloidal mirror M4.

The EUV chamber 40 may include a window W1 and an EUV collector mirror 41, in addition to the above-mentioned target supply unit. The amplified pulsed laser beam reflected by the off-axis paraboloidal mirror M4 may be introduced into the EUV chamber 40 through the window W1. The EUV collector mirror 41 may collect and reflect EUV light emitted from plasma generated in the plasma generation region P1 such that the EUV light is focused at a predetermined point (intermediate focus P2) outside the EUV chamber 40. The EUV collector mirror 41 may have a through-hole 41a through which the amplified pulsed laser beam passes, from the back side thereof, to travel toward the plasma generation region P1. The amplified pulsed laser beam may be reflected by the off-axis paraboloidal mirror M4 and be focused, traveling through the window W1 and the through-hole 41a, on a target supplied to the plasma generation region P1.

EUV light with a desired wavelength to be used in an exposure apparatus may be emitted from the plasma generated as the target is irradiated with the amplified pulsed laser beam in the plasma generation region P1. As the target substance, tin (Sn) can be used, for example. In this case, Sn plasma may emit EUV light with a desired wavelength of approximately 13.5 nm.

As described above, the EUV light emitted from the plasma generated in the plasma generation region P1 may be focused at the intermediate focus P2 outside the EUV chamber 40. An aperture 42 is positioned at the intermediate focus P2, for example. Thus, the EUV light focused at the intermediate focus P2 may be introduced into the exposure apparatus (not shown) through the aperture 42.

As illustrated in FIG. 2, the semiconductor laser 10, the regenerative amplifier 20, and an amplifier 30 which is configured of the pre-amplifier PA and the main amplifier MA shown in FIG. 1 may constitute the laser apparatus 100 of the first embodiment.

Next, a process in which an amplified pulsed laser beam is outputted in the first embodiment will be described in detail with reference to FIG. 2. As illustrated in FIG. 2, a seed beam LS outputted from the semiconductor laser 10 under the control of the semiconductor laser controller 18 (see FIG. 1) may be guided into the regenerative amplifier 20. The regenerative amplifier 20 may be filled with a gain medium for amplifying the seed beam LS. As such gain medium, for example, a $CO_2$-gas gain medium C20 containing $CO_2$ gas can be used. The seed beam LS having entered the regenerative amplifier 20 may be amplified by being reciprocated once or more times through the $CO_2$-gas gain medium C20 inside the regenerative amplifier 20, and may then be outputted as a regenerative amplified pulsed laser beam L1.

The regenerative amplified pulsed laser beam L1 outputted from the regenerative amplifier 20 may be guided to the above-mentioned amplifier 30 configured of the pre-amplifier PA and the main amplifier MA (see FIG. 1). In the first embodiment, the regenerative amplified pulsed laser beam L1 may be first amplified by the pre-amplifier PA, and may then be further amplified by the main amplifier MA (see FIG. 1). After that, the regenerative amplified pulsed laser beam L1 having been amplified by the regenerative amplifier 20 may be outputted as an amplified pulsed laser beam L2 from the amplifier 30.

The $CO_2$-gas gain medium C20 can be used as gain media in the pre-amplifier PA and in the main amplifier MA, as in the regenerative amplifier 20. By using the same type of gain media in the regenerative amplifier 20 and in the amplifier 30 disposed downstream thereof, one or more amplification lines of both the regenerative amplifier 20 and the amplifier 30 can be made to coincide with each other. Thus, the pulsed laser beam can be amplified more efficiently. However, this disclosure is not limited thereto, and a regenerative amplifier and an amplifier filled with different gain media may also be combined.

The pulse width of a pulsed laser beam required of a driver laser in the LPP type system is relatively short, which is about 10 to 100 ns. Thus, the optical path length in the regenerative amplifier 20 may need to be increased so that a low-intensity, short-pulsed laser beam outputted from the semiconductor laser 10, such as a QCL, with a predetermined pulse width can be amplified efficiently. For example, an optical path length L in the regenerative amplifier 20 which is necessary to amplify a pulsed laser beam having a pulse width T is given by the following Expression (1):

$$L = T \times C \tag{1}$$

where C represents the light speed.

Thus, for example, in order to amplify a pulsed laser beam having a pulse width T of 50 ns, the optical path length L of the regenerative amplifier 20 may need to be considerably long, such as 15 m ($=3E^8 \times 50 \times 10E^{-9}$). Accordingly, in the first embodiment, a multipass optical path may be formed in the regenerative amplifier 20, as will be described later. This allows a pulsed laser beam having a relatively short pulse width to be stably amplified while the size of the regenerative amplifier 20 is not increased.

Next, the regenerative amplifier 20 of the first embodiment will be described in detail with reference to FIG. 3. As illustrated in FIG. 3, the regenerative amplifier 20 may include the quarter-wave plate 22, the EOM 23a such as an electro-optic (EO) Pockels cell, the input-side polarizer 24a, the slab amplifier 25, an output-side polarizer 24b, and the EOM 23b such as an EO Pockels cell. These components may be arranged in that order from the resonator mirror 21a side on the optical path of the optical resonator configured of the resonator mirrors 21a and 21b. The quarter-wave plate 22 may delay one component of a pulsed laser beam (a seed beam LS to be amplified) incident thereon by 90 degrees in phase. The polarizer 24a may serve as a polarization beam splitter which reflects a beam incident thereon in a specific polarization state (S-polarized state in the first embodiment) and transmits a beam incident thereon in the other polarization state. The slab amplifier 25 may be filled with a $CO_2$-gas gain medium C20. The polarizer 24b may serve as a polarization beam splitter which reflects a beam incident thereon in a specific polarization state (S-polarized state in the first embodiment) and transmits a beam incident thereon in the other polarization state. The polarizer 24a, the EOM 23a, and the quarter-wave plate 22 may, in cooperation, function as an input coupling unit for guiding the seed beam LS outputted from the semiconductor laser 10 into the regenerative amplifier 20. The polarizer 24b and the EOM 23b, on the other hand, may, in cooperation, function as an output coupling unit for outputting a pulsed laser beam amplified by the regenerative amplifier 20 as the regenerative amplified pulsed laser beam L1.

The regenerative amplifier 20 may also include a pair of concave high-reflection (HR) mirrors 26 and 27 arranged to form a multipass optical path along which the pulsed laser beam is reciprocated once or more times inside the slab amplifier 25. That is, in the regenerative amplifier 20, an optical path C1 between the two resonator mirrors 21a and 21b may include a multipass C2 formed by the concave HR mirrors 26 and 27.

For example, reflective surfaces of the concave HR mirrors 26 and 27 are spherical-concave such that an image Ia of a pulsed laser beam at a certain point (first position), on the optical path C1, between the resonator mirror 21a and a pulsed-laser-beam input/output edge of the slab amplifier 25 (referred to as an incident optical image) is simply transferred as an image Ib of the pulsed laser beam at another certain point (second position), on the optical path C1, between the pulsed-laser-beam output/input edge of the slab amplifier 25 and the resonator mirror 21b (referred to as a transfer optical image). In other words, the concave HR mirrors 26 and 27 are spherical-concave such that the input-side optical image (incident optical image Ia) is simply transferred as the output-side optical image (transfer optical image Ib) through the multipass C2 along which the pulsed laser beam is reciprocated inside the slab amplifier 25.

With this configuration, even when the optical path length (the length of the resonator formed by the resonator mirrors 21a and 21b) is increased by having a multipass (zigzag) optical path being formed, it is possible to prevent the beam axis of an entering pulsed laser beam and the exit position of an exiting pulsed laser beam from further deviating, dependent on the optical path length, due to the deviation of the beam axis of the entering pulsed laser beam. As a result, the laser beam can be amplified to desired intensity and to a desired pulse width, and the beam axis of the laser beam outputted from the regenerative amplifier 20 can be stabilized.

In the case illustrated in FIG. 3, an incident optical image Ia of the pulsed laser beam at an intersection where the optical path C1 meets a plane along the bottommost portion of the spherical-concave reflective surface of the concave HR mirror 27 to the incident side of the seed beam LS may be transferred as a transfer optical image Ib of the pulsed laser beam at an intersection where the optical path C1 meets a plane along the bottommost portion of the spherical-concave reflective surface of the concave HR mirror 26 to the output side of the regenerative amplified pulsed laser beam L1. However, this disclosure is not limited to this case, and various modifications are possible. For example, an incident optical image Ia of a pulsed laser beam incident on the resonator mirror 21a may simply be transferred as a transfer optical image Ib of the pulsed laser beam incident on the resonator mirror 21b, or an incident optical image Ia of a pulsed laser beam incident on the polarizer 24a may simply be transferred as a transfer optical image Ib of the pulsed laser beam incident on the polarizer 24b.

Figures 4A, 4B, 4C, 4D, 4E, 4F:
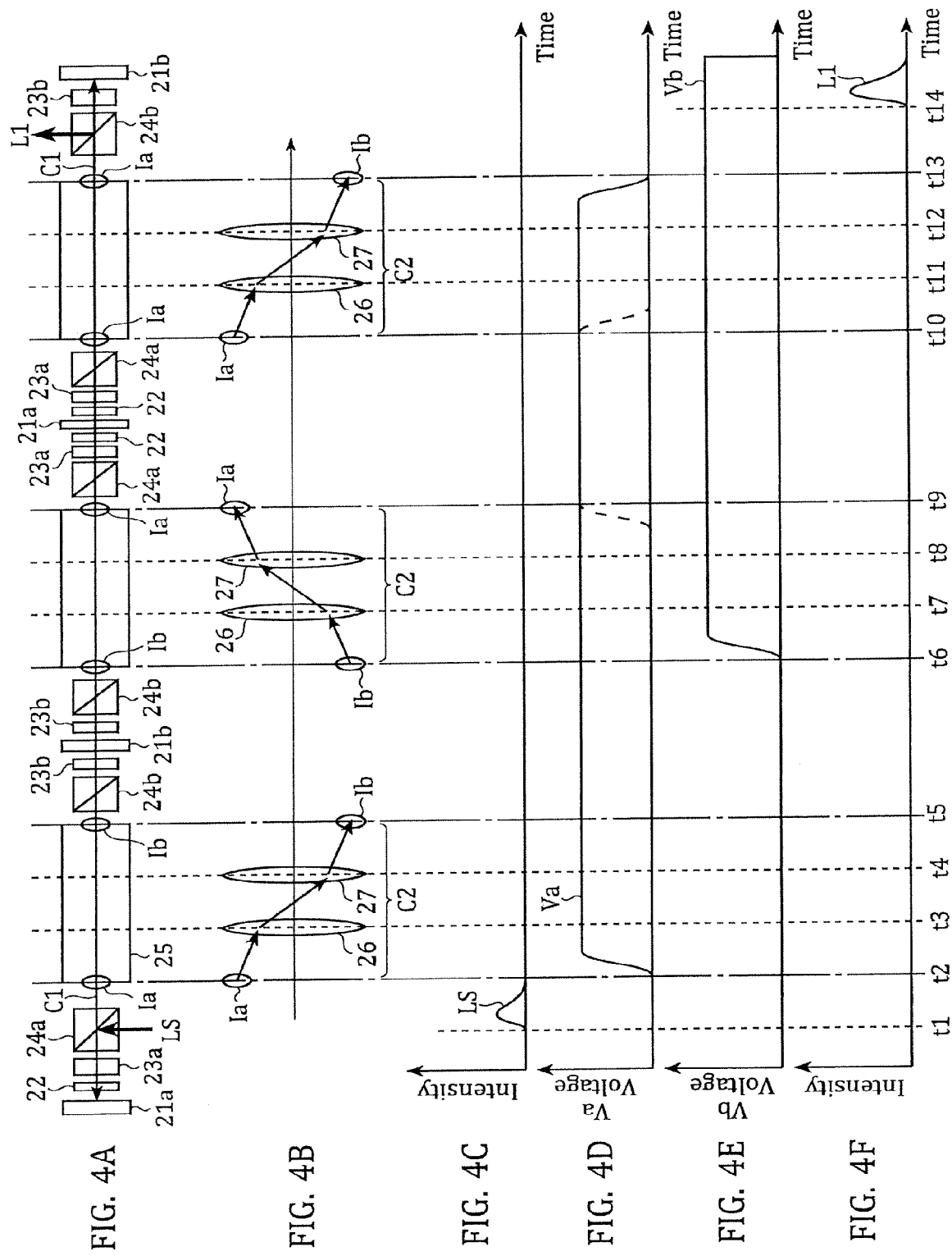
FIGS. 4A through 4F describe overall operation of the regenerative amplifier of the first embodiment.

Next, the operation of the regenerative amplifier 20 illustrated in FIG. 3 will be described in detail with reference to FIGS. 4A through 4F. FIGS. 4A through 4F illustrate the overall operation of the regenerative amplifier 20 of the first embodiment, in which a seed beam LS introduced into the regenerative amplifier 20 is reciprocated one and a half times in the resonator configured of the resonator mirrors 21a and 21b. FIG. 4A plainly illustrates the overall operation of the regenerative amplifier 20 illustrated in FIG. 3. FIG. 4B is an optical system diagram schematically illustrating a multipass formed in the slab amplifier 25 of the regenerative amplifier 20 illustrated in FIG. 3. FIGS. 4C through 4F are timing charts showing the overall operation of the regenerative amplifier 20 illustrated in FIG. 3. For the sake of simplicity, in FIGS. 4A through 4F, the plane along the bottommost portion of the spherical-concave reflective surface of the concave HR mirror 27 substantially coincide with a surface of the slab amplifier 25 facing the incident side of the seed beam LS, and the plane along the bottommost portion of the spherical-concave reflective surface of the concave HR mirror 26 substantially coincides with a surface of the slab amplifier 25 facing the output side of the regenerative amplified pulsed laser beam L1.

As illustrated, the S-polarized component of a seed beam LS incident on the polarizer 24a (see FIG. 4A) at timing t1 (see FIG. 4C) may be reflected with high reflectivity by the polarizer 24a, and introduced into the regenerative amplifier 20. The seed beam LS having entered the regenerative amplifier 20 may pass, without a phase shift, through the EOM 23a to which voltage is not applied (see FIG. 4D), and pass through the quarter-wave plate 22, where one component of the pulsed laser beam is delayed by 90 degrees in phase, whereby the pulsed laser beam is converted into a circularly polarized pulsed laser beam. Subsequently, the circularly polarized pulsed laser beam may be reflected with high reflectivity by the resonator mirror 21a, and pass through the quarter-wave plate 22 again, where the circularly polarized pulsed laser beam is converted into a pulsed laser beam that is in the P-polarized state with respect to the polarizer 24a. This pulsed laser beam may pass, without a phase shift, through the EOM 23a to which voltage is not applied (see FIG. 4D), and be transmitted through the polarizer 24a. After that, the pulsed laser beam enters the slab amplifier 25 at timing t2 (see FIG. 4A). As illustrated in FIG. 4B, the pulsed laser beam having entered the slab amplifier 25 may be reflected by the concave HR mirrors 26 and 27 (timing t3 and t4 in FIG. 4B), to thereby be reciprocated once or more times (one and a half times in the first embodiment) between the concave HR mirrors 26 and 27. Thus, the pulsed laser beam may pass through the slab amplifier 25 a plurality of times (three times in the first embodiment). As a result, the pulsed laser beam is subjected to multipass amplification.

After that, the amplified pulsed laser beam may exit from the slab amplifier 25 at timing t5, and be transmitted through the polarizer 24b. Then, the pulsed laser beam may pass, without a phase shift, through the EOM 23b to which voltage is not applied (see FIG. 4E), and be reflected with high reflectivity by the resonator mirror 21b. The reflected pulsed laser beam may pass through the EOM 23b to which voltage is not applied (see FIG. 4E), and then pass through the polarizer 24b. At timing t6 (see FIG. 4A), the pulsed laser beam may reenter the slab amplifier 25. As illustrated in FIG. 4B, the pulsed laser beam having entered the slab amplifier 25 may be reflected by the concave HR mirrors 27 and 26 (timing t7 and t8 in FIG. 4B), similarly to the above, to thereby be reciprocated once or more times (one and a half times in the first embodiment) between the concave HR mirrors 27 and 26. Thus, the pulsed laser beam may pass through the slab amplifier 25 a plurality of times (three times in the first embodiment). As a result, the pulsed laser beam is subjected to multipass amplification.

After that, the amplified pulsed laser beam may exit from the slab amplifier 25 at timing t9, be transmitted through the polarizer 24a, and pass through the EOM 23a to which voltage is applied (see FIG. 4D). For regenerative amplification of the pulsed laser beam, voltage is applied to the EOM 23a. In the example illustrated in FIGS. 4A through 4F, voltage is applied in timing t2 through t9, in which predetermined voltage Va is applied, and voltage is turned off in timing t10 through t13. When passing through the EOM 23a to which the voltage Va is applied, one component of the pulsed laser beam may be delayed by 90 degrees in phase, whereby the pulsed laser beam is converted into a circularly polarized pulsed laser beam. Next, the circularly polarized pulsed laser beam may pass through the quarter-wave plate 22, to thereby be converted into a pulsed laser beam that is in the S-polarized state with respect to the polarizer 24a. After that, the pulsed laser beam may be reflected with high reflectivity by the resonator mirror 21a, and pass again through the quarter-wave plate 22 to thereby be converted into a circularly polarized laser beam. Subsequently, the circularly polarized pulsed laser beam may pass through the EOM 23a to which the voltage Va is applied (see FIG. 4D), to thereby be converted again into a pulsed laser beam which is in the P-polarized state with respect to the polarizer 24a. This pulsed laser beam may pass through the polarizer 24a and reenter the slab amplifier 25 at timing t10 (see FIG. 4A). As illustrated in FIG. 4B, the pulsed laser beam having entered the slab amplifier 25 may be reflected by the concave HR mirrors 26 and 27, similarly to the above (timing t11 and t12 in FIG. 4B), to thereby be reciprocated once or more times (one and a half times in the first embodiment) between the concave HR mirrors 26 and 27. With this, the pulsed laser beam may pass through the slab amplifier 25 a plurality of times (three times in the first embodiment). As a result, the pulsed laser beam is subjected to multipass amplification.

After that, the amplified pulsed laser beam may exit from the slab amplifier 25 at timing t13, pass through the polarizer 24b, and pass through the EOM 23b to which voltage is applied (see FIG. 4E) to thereby be converted into a circularly polarized pulsed laser beam. Voltage may be applied to the EOM 23b in order to cause the regenerative amplified pulsed laser beam to be outputted from the regenerative amplifier 20. In the example illustrated in FIGS. 4A through 4F, voltage may be applied in timing t6 through t14, and voltage may be turned off after the regenerative amplified laser beam is outputted from the regenerative amplifier 20. Subsequently, the circularly polarized pulsed laser beam may be reflected with high reflectivity by the resonator mirror 21b, and pass again through the EOM 23b to which voltage is applied (see FIG. 4E), to thereby be converted into a pulsed laser beam which is in the S-polarized state with respect to the polarizer 24b. The pulsed laser beam which is in the S-polarized state with respect to the polarizer 24b may be reflected with high reflectivity by the polarizer 24b. With this, the pulsed laser beam having been subjected to multipass amplification between the resonator mirrors 21a and 21b may be outputted as the regenerative amplified pulsed laser beam L1 from the regenerative amplifier 20 after timing t14 (see FIG. 4D).

As described above, the pulsed laser beam having been introduced into the regenerative amplifier 20 may be reciprocated in the slab amplifier 25 while traveling between the resonator mirrors 21 and 21b constituting the optical resonator, to thereby be subjected to multipass amplification. The pulsed laser beam having been introduced into the regenerative amplifier 20 may be reciprocated a plurality of times between the resonator mirrors 21a and 21b until it is amplified at least to desired intensity.

As described above, in the first embodiment, the optical image (incident optical image Ia) on the input side of the multipass along which the pulsed laser beam is reciprocated inside the slab amplifier 25 may simply be transferred as the optical image (transfer optical image Ib) on the output side of the multipass. Accordingly, even when the optical path length is increased by having a multipass optical path being formed, it is possible to prevent the beam axis of an entering pulsed laser beam and the exit position of an exiting pulsed laser beam from further deviating, dependent on the optical path length, due to the deviation of the beam axis of the entering pulsed laser beam. As a result, the regenerative amplifier 20 of the first embodiment makes it possible to stabilize the beam axis of the pulsed laser beam and to amplify the pulsed laser beam stably.

First Modification

Figure 5:
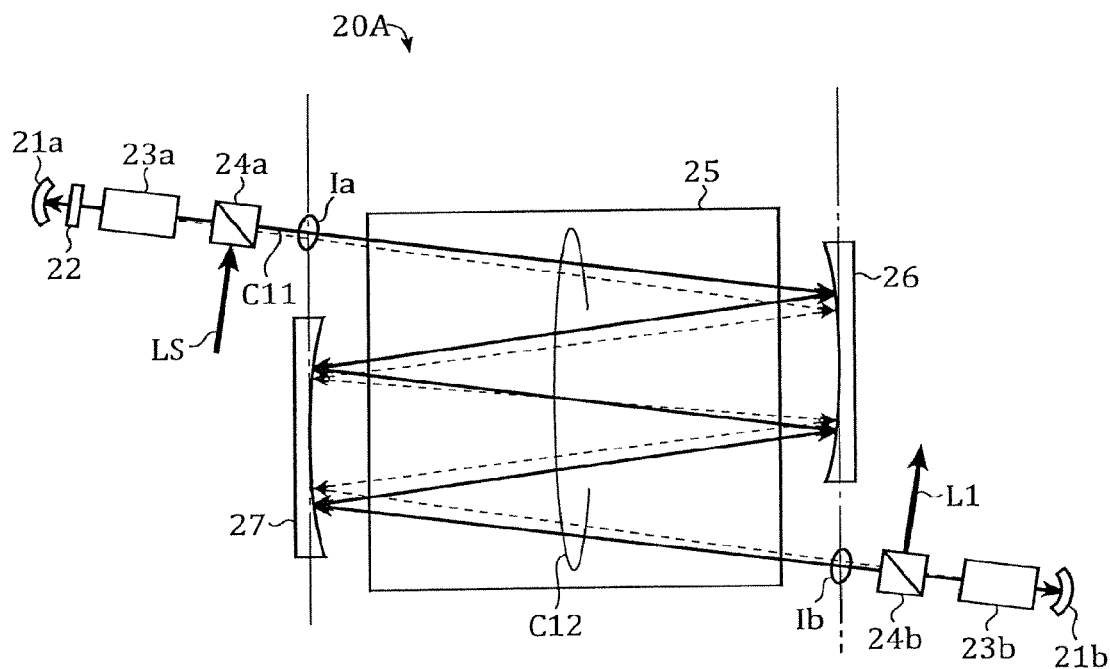
FIG. 5 illustrates a schematic configuration of a regenerative amplifier according to a first modification of the first embodiment.
Figure 6:
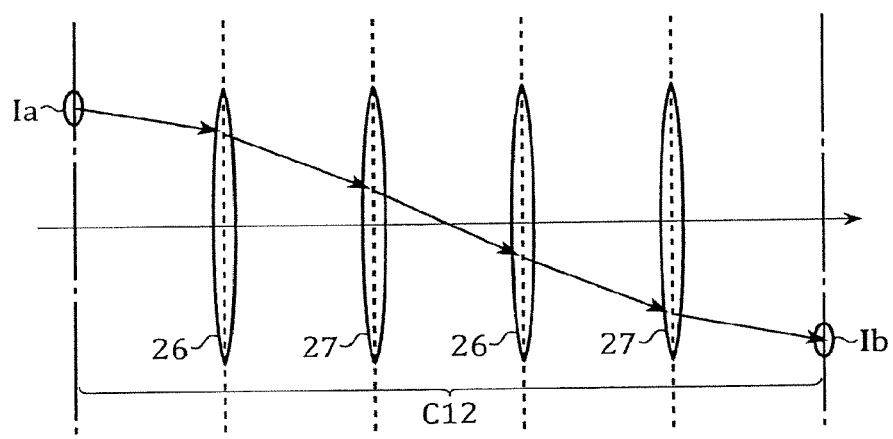
FIG. 6 is a conceptual view schematically illustrating a multipass formed in a slab amplifier of the regenerative amplifier illustrated in FIG. 5.

In the above-described first embodiment, the pulsed laser beam (seed beam LS) has been reciprocated one and a half times in the slab amplifier 25 of the regenerative amplifier 20. However, this disclosure is not limited thereto, and various modifications are possible. For example, as in a regenerative amplifier 20A illustrated in FIG. 5 according to a first modification of the first embodiment, an optical path C11 of a pulsed laser beam may include a multipass C12 along which the pulsed laser beam is reciprocated two and a half times (or twice, three times, or more times) inside a slab amplifier 25. FIG. 5 illustrates the schematic configuration of the regenerative amplifier 20A of the first modification, and FIG. 6 schematically illustrates an optical system formed in the slab amplifier 25 of the regenerative amplifier 20A illustrated in FIG. 5. As illustrated in FIG. 6, in the regenerative amplifier 20A of the first modification, a pulsed laser beam having entered the slab amplifier 25 may be reflected by the concave HR mirrors 26 and 27, specifically, twice by each of the concave HR mirrors 26 and 27. Thus, the pulsed laser beam may pass through the slab amplifier 25 five times.

This makes it possible to reduce the size of the slab amplifier 25 in a direction normal to the surfaces of the concave HR mirrors 26 and 27, whereby the size of the regenerative amplifier 20A can be reduced.

Second Modification

Figure 7:
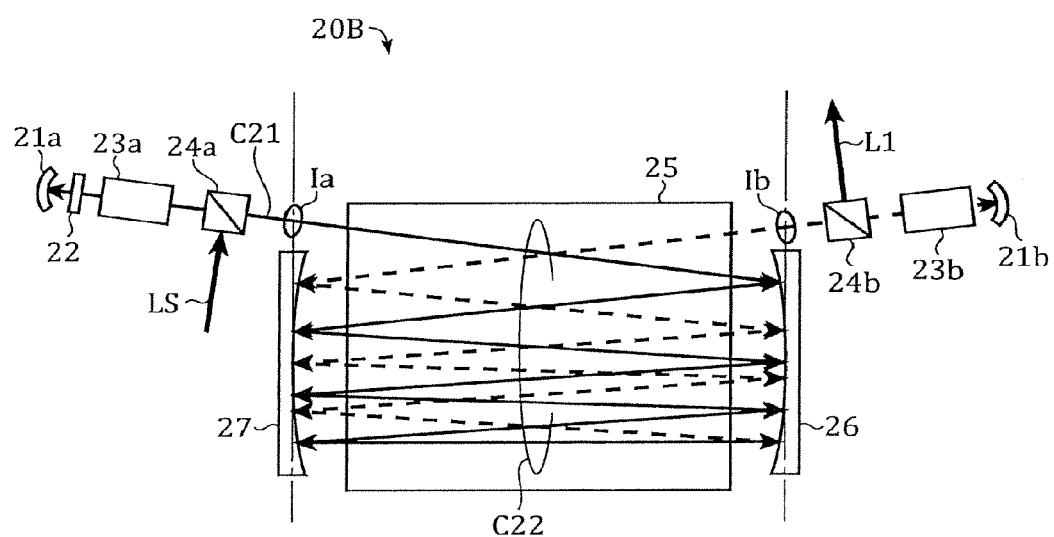
FIG. 7 illustrates a schematic configuration of a regenerative amplifier according to a second modification of the first embodiment.
Figure 8:
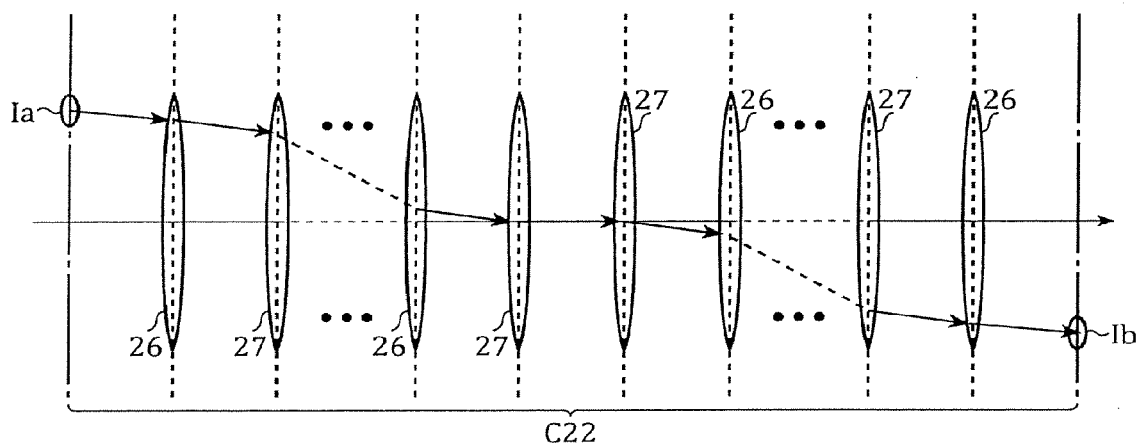
FIG. 8 is a conceptual view schematically illustrating a multipass formed in a slab amplifier of the regenerative amplifier illustrated in FIG. 7.

In the above-described first embodiment, an incident end and an exit end of the pulsed laser beam with respect to the slab amplifier 25 have been located diagonally on two opposing surfaces of the slab amplifier 25 shaped in a rectangular parallelpiped. However, this disclosure is not limited thereto. FIG. 7 illustrates the schematic configuration of a regenerative amplifier 20B according to a second modification of the first embodiment, and FIG. 8 is a conceptual view schematically illustrating an optical system formed in a slab amplifier 25 of the regenerative amplifier 20B illustrated in FIG. 7. In the regenerative amplifier 20B of FIG. 7, for example, the incident end and the exit end of the pulsed laser beam may be located on the same side (upper side or lower side in the plane of the figure) of opposing surfaces of the slab amplifier 25, as viewed in a direction perpendicular to the plane of the figure. In this case, as illustrated in FIG. 8, a multipass C22 along which the pulsed laser beam may travel substantially all over the slab amplifier 25 may be formed in an optical path C21 in the slab amplifier 25. A pulsed laser beam having entered the slab amplifier 25 may first travel to the side opposite the side of the incident and exit ends while being reflected repeatedly, travel then to the side of the incident and exit ends while being reflected repeatedly, and finally exit from the exit end. That is, in the second modification, the pulsed laser beam may be reciprocated once in the slab amplifier 25 in a direction substantially perpendicular to the optical path C21.

This configuration makes it possible to further reduce the size of the slab amplifier 25 in the direction normal to the surfaces of the concave HR mirrors 26 and 27, as well as to amplify the pulsed laser beam by fully utilizing a $CO_2$-gas gain medium C20 in the slab amplifier 25, which may enhance gain efficiency. As a result, the size of the regenerative amplifier can further be reduced, and a high-power regenerative amplified pulsed laser beam can be outputted with lower energy.

Third Modification

Figure 9:
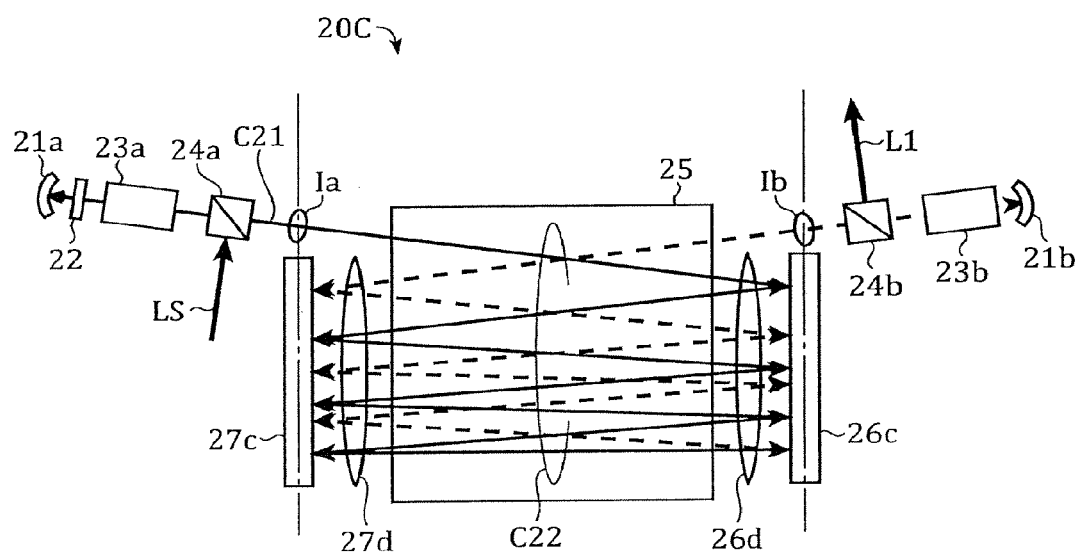
FIG. 9 illustrates a schematic configuration of a regenerative amplifier according to a third modification of the first embodiment.

While the concave HR mirrors 26 and 27 have been used to configure a multipass along which the pulsed laser beam is reciprocated inside the slab amplifier 25 in the above-described first embodiment, this disclosure is not limited thereto. FIG. 9 illustrates the schematic configuration of a regenerative amplifier 20C according to a third modification of the first embodiment. For example, as in the regenerative amplifier 20C shown in FIG. 9, the concave HR mirror 26 may be replaced by a reflection optical system configured of a flat HR mirror 26c and a spherical lens 26d provided to a reflective surface side of the flat HR mirror 26c, and the concave HR mirror 27 may be replaced by a reflection optical system configured of a flat HR mirror 27c and a spherical lens 27d provided to a reflective surface side of the flat HR mirror 27c. Such a configuration can also provide advantageous effects similar to those of the above-described first embodiment.

Second Embodiment

Figure 10:
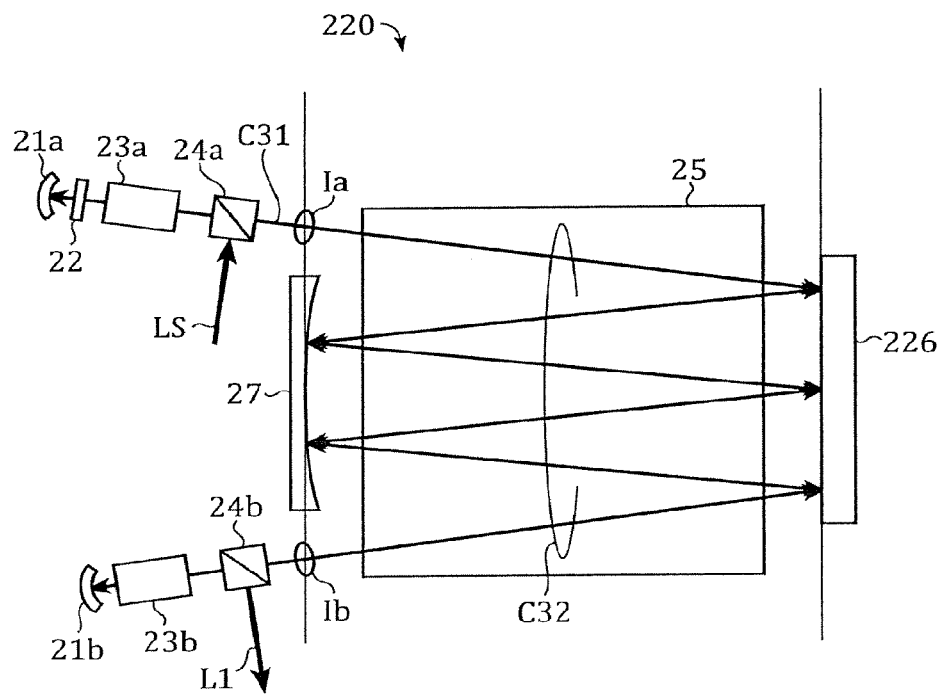
FIG. 10 illustrates a schematic configuration of a regenerative amplifier according to a second embodiment of this disclosure.
Figure 11:
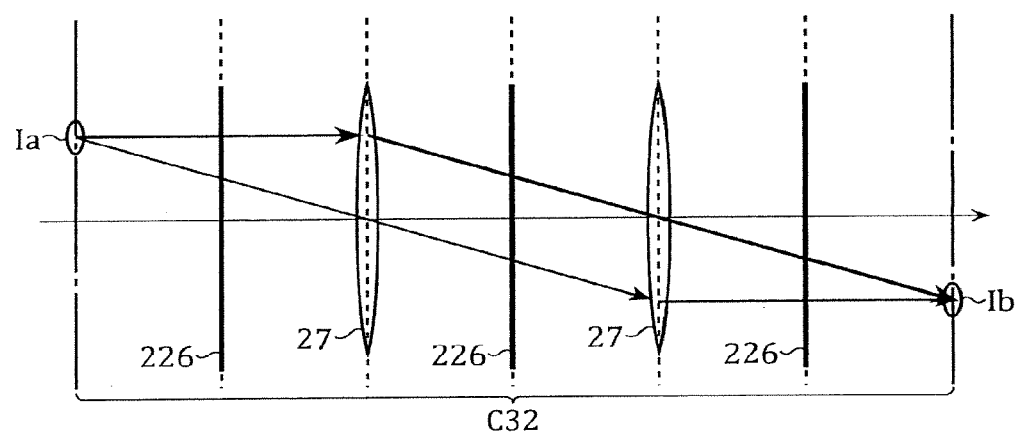
FIG. 11 is a conceptual view schematically illustrating a multipass formed in a slab amplifier of the regenerative amplifier illustrated in FIG. 10.

Next, a regenerative amplifier, a laser apparatus, and an EUV light generation system according to a second embodiment of this disclosure will be described in detail with reference to the drawings. FIG. 10 illustrates the schematic configuration of the regenerative amplifier of the second embodiment, and FIG. 11 is a conceptual view schematically illustrating an optical system formed in a slab amplifier of the regenerative amplifier shown in FIG. 10. The laser apparatus and the EUV light generation system of the second embodiment are similar in configuration to the laser apparatus 100 and the EUV light generation system 1 of the above-described first embodiment except in that the regenerative amplifier 20 is replaced by a regenerative amplifier 220 illustrated in FIG. 10. Hence, detailed descriptions of the laser apparatus and the EUV light generation system are omitted here.

As illustrated in FIGS. 10 and 11, the regenerative amplifier 220 of the second embodiment is similar in configuration to the regenerative amplifier 20 of the first embodiment except in that one of the pair of the concave HR mirrors 26 and 27 provided with the slab amplifier 25 being disposed therebetween (the concave HR mirror 26 in the second embodiment) is replaced by a flat HR mirror 226. In FIGS. 10 and 11, the mirror on which a pulsed laser beam having entered the slab amplifier 25 from the incident side of the seed beam LS is incident first may be replaced by the flat HR mirror 226.

In the second embodiment, a reflective surface of the concave HR mirror 27 is spherical-concave such that an incident optical image Ia of a pulsed laser beam at a certain point, on the optical path C31, between the resonator mirror 21a and a pulsed-laser-beam input/output edge of the slab amplifier 25 may simply be transferred as a transfer optical image Ib of the pulsed laser beam at another certain point, on the optical path C31, between the pulsed-laser-beam output/input edge of the slab amplifier 25 and the resonator mirror 21b. In other words, the concave HR mirror 27 may be spherical-concave such that the input-side optical image (incident optical image Ia) may simply be transferred as the output-side optical image (transfer optical image Ib) through the multipass C32 along which the pulsed laser beam is reciprocated inside the slab amplifier 25.

With this configuration, similarly to the above-described first embodiment, even when the optical path length is increased by having a multipass optical path being formed, it is possible to prevent the beam axis of an entering pulsed laser beam and the exit position of an exiting pulsed laser beam from further deviating, dependent on the optical path length, due to the deviation of the beam axis of the entering pulsed laser beam. As a result, the pulsed laser beam can be stably amplified, and the amplified pulsed laser beam can be stably outputted from the regenerative amplifier 220.

While the incident and exit ends of the pulsed laser beam are located on the same side of the slab amplifier 25 shown in FIGS. 10 and 11, this disclosure is not limited thereto. For example, as illustrated in FIG. 3 or 7, the pulsed laser beam may be outputted from the side opposing the incident end.

Modification

Figure 12:
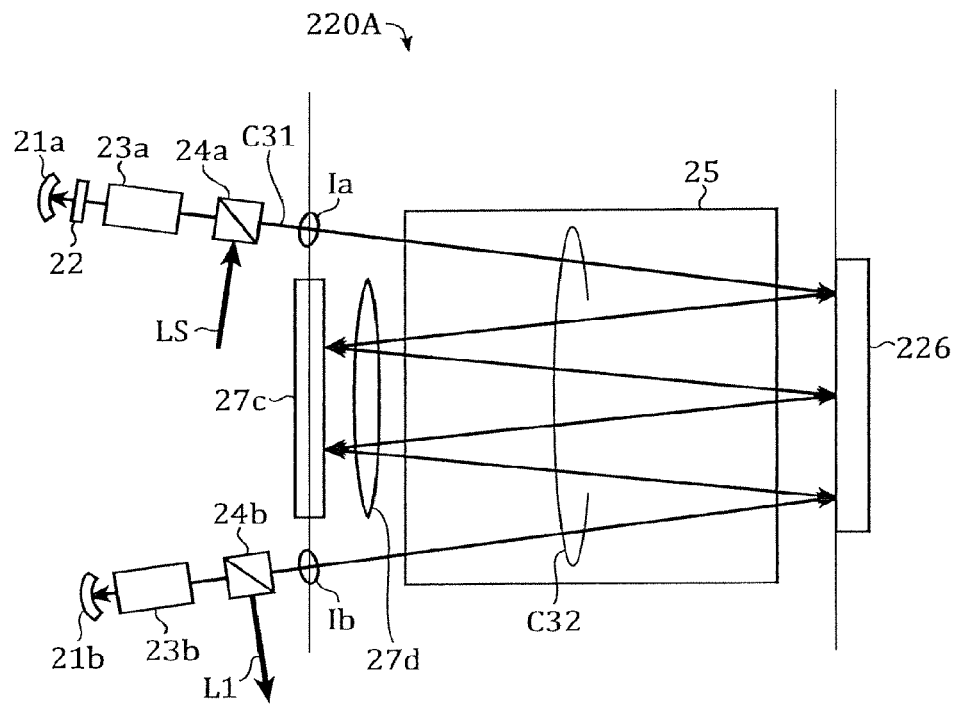
FIG. 12 illustrates a schematic configuration of a regenerative amplifier according to a modification of the second embodiment.

Although the concave HR mirror 27 has been used as one of the mirrors that configures a multipass along which the pulsed laser beam is reciprocated inside the slab amplifier 25 and the flat HR mirror 226 has been used as the other mirror in the above-described second embodiment, this disclosure is not limited thereto. FIG. 12 illustrates the schematic configuration of a regenerative amplifier 220A according to a modification of the second embodiment. As can be seen in the regenerative amplifier 220A, the concave HR mirror 27 may be replaced by a reflective optical system configured of a flat HR mirror 27c and a spherical lens 27d provided to oppose the flat HR mirror 27c, as in the third modification of the first embodiment. This configuration can also provide advantageous effects similar to those of the second embodiment.

Third Embodiment

Figure 13:
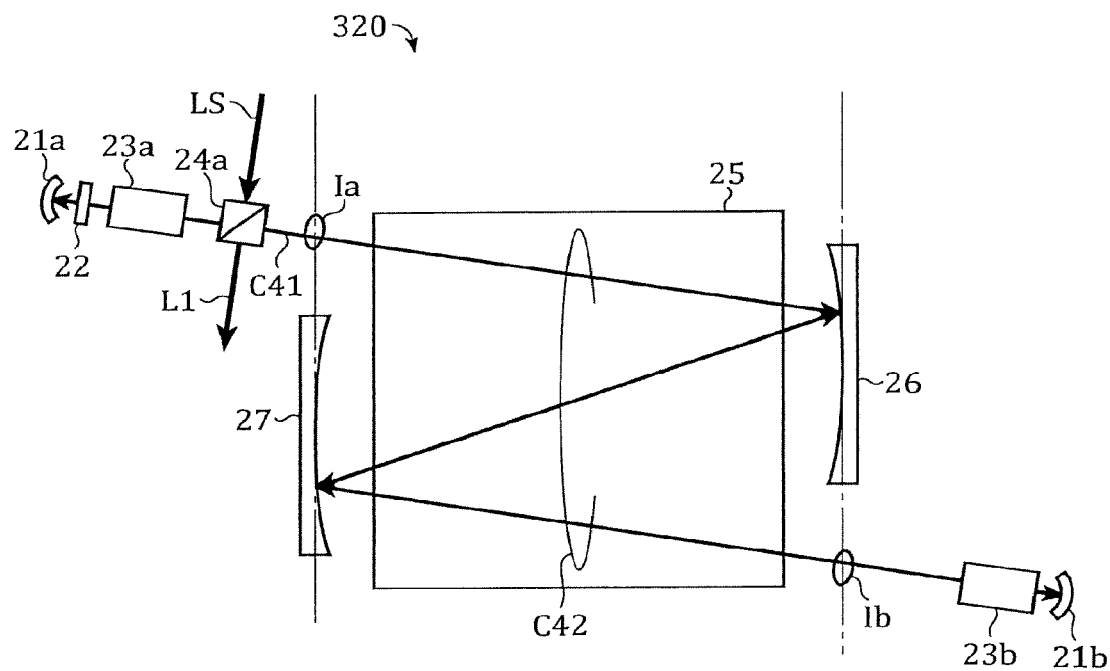
FIG. 13 illustrates a schematic configuration of a regenerative amplifier according to a third embodiment of this disclosure.

Next, a regenerative amplifier, a laser apparatus, and an EUV light generation system according to a third embodiment of this disclosure will be described in detail with reference to the drawings. FIG. 13 illustrates the schematic configuration of a regenerative amplifier 320 of the third embodiment. FIGS. 14A through 14F are schematic diagrams showing overall operation of the regenerative amplifier 320 of the third embodiment. FIG. 14A is a schematic view plainly describing the overall operation of the regenerative amplifier 320 illustrated in FIG. 13. FIG. 14B is a conceptual view schematically illustrating a multipass formed in a slab amplifier 25 of the regenerative amplifier 320 of FIG. 13. FIGS. 14C through 14F are timing charts showing the overall operation of the regenerative amplifier 320 of FIG. 13. The laser apparatus and the EUV light generation system of the third embodiment are similar in configuration to the laser apparatus 100 and the EUV light generation system 1 of the above-described first embodiment except in that the regenerative amplifier 20 may be replaced by the regenerative amplifier 320 illustrated in FIG. 13. Hence, detailed descriptions of the laser apparatus and the EUV light generation system are omitted here.

As is apparent from the comparison of FIGS. 3 and 13, in the regenerative amplifier 320 of the third embodiment, the polarizer 24a may be used as a beam splitter for introducing a seed beam LS into the regenerative amplifier 320 as well as for outputting a regenerative amplified pulsed laser beam L1 from the regenerative amplifier 320. Thus, the polarizer 24b provided to the output side of the regenerative amplified pulsed laser beam L1, for example, in the regenerative amplifier 20 of the first embodiment is not provided in the regenerative amplifier 320. Other configurations are similar to those adopted in any of the above-described embodiments; therefore, detailed descriptions thereof are omitted here.

Next, the operation of the regenerative amplifier 320 of FIG. 13 will be described in detail with reference to FIGS. 14A through 14F. FIGS. 14A through 14F show a case in which a seed beam LS having been introduced into the regenerative amplifier 320 is reciprocated twice in a resonator configured of resonator mirrors 21a and 21b.

FIGS. 14A through 14F show the overall operation of the regenerative amplifier 320 of the third embodiment. For the sake of simplicity, in FIGS. 14A through 14F, a plane along the bottommost portion of a spherical-concave reflective surface of a concave HR mirror 27 substantially coincides with a surface of the slab amplifier 25 facing the incident side of a seed beam LS, and a plane along the bottommost portion of a spherical-concave reflective surface of a concave HR mirror 26 substantially coincides with a surface of the slab amplifier 25 facing the output side of a regenerative amplified pulsed laser beam L1. Operation from the time when the seed beam LS enters the regenerative amplifier 320 to the time when the seed beam LS is reflected three times by the resonator mirrors 21a and 21b and exits from the slab amplifier 25 is similar to the operation during the timing t1 through t13 in the above-described first embodiment shown in FIGS. 4A through 4F. Therefore, detailed descriptions thereof are omitted here.

As illustrated in FIGS. 4A through 4F, a seed beam LS may be incident on the polarizer 24a (see FIG. 14A) at timing t1 (see FIG. 14C), and the S-polarized component of the seed beam LS may be outputted from the slab amplifier 25 toward the resonator mirror 21b by operation similar to the operation during the timing t1 through t13 in the first embodiment of FIGS. 4A through 4F.

After that, the pulsed laser beam having been subjected to multipass amplification may be outputted from the slab amplifier 25 at timing t13, and pass through an EOM 23b to which voltage is applied (see FIG. 4E), to thereby be converted into a circularly polarized pulsed laser beam. Voltage may be applied to the EOM 23b in order to cause a pulsed laser beam to be outputted from the regenerative amplifier 320. In FIGS. 14A through 14F, voltage Vb may be applied in timing t6 through t13, and the voltage Vb may be turned off in timing t31 through t35. Subsequently, the circularly polarized pulsed laser beam may be reflected with high reflectivity by the resonator mirror 21b, and pass again through the EOM 23b to which voltage is applied (see FIG. 4E), whereby the pulsed laser beam is converted into a pulsed laser beam which is in the S-polarized state with respect to the polarizer 24a. The pulsed laser beam which is in the S-polarized state with respect to the polarizer 24a may reenter the slab amplifier 25 at timing t31 (see FIG. 14A). As illustrated in FIG. 14B, the pulsed laser beam having entered the slab amplifier 25 may be reflected by the concave HR mirrors 27 and 26 (timing t32 and t33 in FIG. 14B), similarly to the above, to thereby be reciprocated once or more times (one and a half times in the third embodiment) between the concave HR mirrors 27 and 26. With this, the pulsed laser beam may pass through the slab amplifier 25 a plurality of times (three times in the third embodiment). As a result, the pulsed laser beam is subjected to multipass amplification.

After that, the amplified pulsed laser beam may be outputted from the slab amplifier 25 at timing t34, and be reflected with high reflectivity by the polarizer 24a. With this, the pulsed laser beam having been subjected to multipass amplification between the resonator mirrors 21a and 21b may be outputted as the regenerative amplified pulsed laser beam L1 from the regenerative amplifier 320 after timing t35 (see FIG. 14F).

As described above, the pulsed laser beam having been introduced into the regenerative amplifier 320 may be subjected to multipass amplification by being reciprocated in the slab amplifier 25 while traveling between the resonator mirrors 21a and 21b constituting the optical resonator. The pulsed laser beam having been introduced into the regenerative amplifier 320 may be reciprocated between the resonator mirrors 21a and 21b until it is amplified at least to desired intensity.

As described above, in the third embodiment, an optical image (incident optical image Ia) on the input side of the multipass along which the pulsed laser beam is reciprocated inside the slab amplifier 25 may simply be transferred as an optical image (transfer optical image Ib) on the output side of the multipass. Thus, even when the optical path length is increased by having a multipass optical path being formed, it is possible to prevent the beam axis of an entering pulsed laser beam and the exit position of an exiting pulsed laser beam from further deviating, dependent on the optical path length, due to the deviation of the beam axis of the entering pulsed laser beam. As a result, the pulsed laser beam may be amplified stably, and the beam axis of the pulsed laser beam outputted from the regenerative amplifier 320 may be stabilized.

Modification

Figure 15:
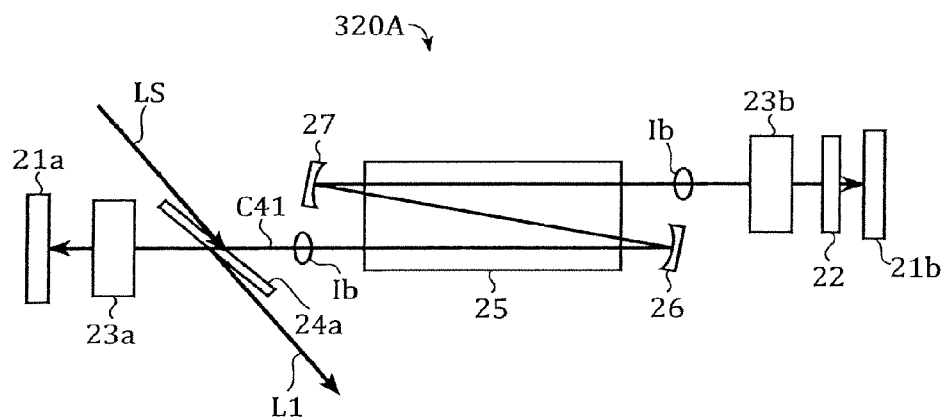
FIG. 15 illustrates a schematic configuration of a regenerative amplifier according to a modification of the third embodiment.

The regenerative amplifier 320 of the third embodiment can, for example, be modified into a regenerative amplifier 320A illustrated in FIG. 15. FIG. 15 illustrates the schematic configuration of the regenerative amplifier 320A of the modification. In the regenerative amplifier 320A of FIG. 15, a quarter-wave plate 22 may be provided right next to a resonator mirror 21b. Further, as illustrated in FIG. 15, the incident angle of the seed beam LS on the regenerative amplifier 320A may not necessarily be perpendicular to an optical path C41 in the regenerative amplifier 320A, and may be inclined to the optical axis C41. Since other configurations are similar to those adopted in the above-described third embodiment, detailed descriptions thereof are omitted here.

Fourth Embodiment

Figure 16:
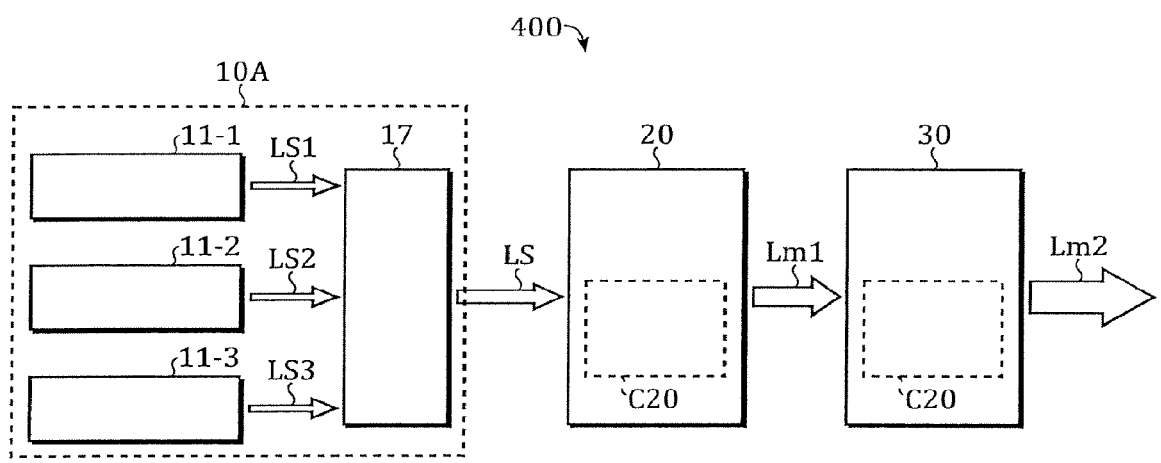
FIG. 16 illustrates a schematic configuration of a laser apparatus according to a fourth embodiment of this disclosure.

In the above-described embodiments, a single semiconductor laser 10 which may oscillate in a single-longitudinal mode or in a multi-longitudinal mode has been used as the master oscillator. In a laser apparatus 400 according to a fourth embodiment, on the other hand, a semiconductor laser 10A may be configured of a plurality of semiconductor devices, each of which may oscillate in a single-longitudinal mode or in a multi-longitudinal mode. FIG. 16 illustrates the schematic configuration of the laser apparatus 400 of the fourth embodiment. As illustrated in FIG. 16, the semiconductor laser 10A may include semiconductor devices 11-1 through 11-3, a resonator similar to that illustrated in FIG. 1, a controller, and so forth. Each of the semiconductor devices 11-1 through 11-3 can independently oscillate a laser beam with a predetermined wavelength, intensity, and pulse width. The semiconductor laser 10A may further include a beam combiner 17 for combining seed beams LS1 through LS3 outputted from the semiconductor devices 11-1 through 11-3, respectively. Thus, the seed beams are combined and the combined laser beam is amplified. Thus, a desired seed beam LS can be outputted and amplified, and an optimal laser condition for EUV light generation can easily be achieved even if a target or an irradiation condition is to be changed. Other configurations are similar to those adopted in any of the above-described embodiments; thus, detailed descriptions thereof are omitted here.

Fifth Embodiment

Figure 17:
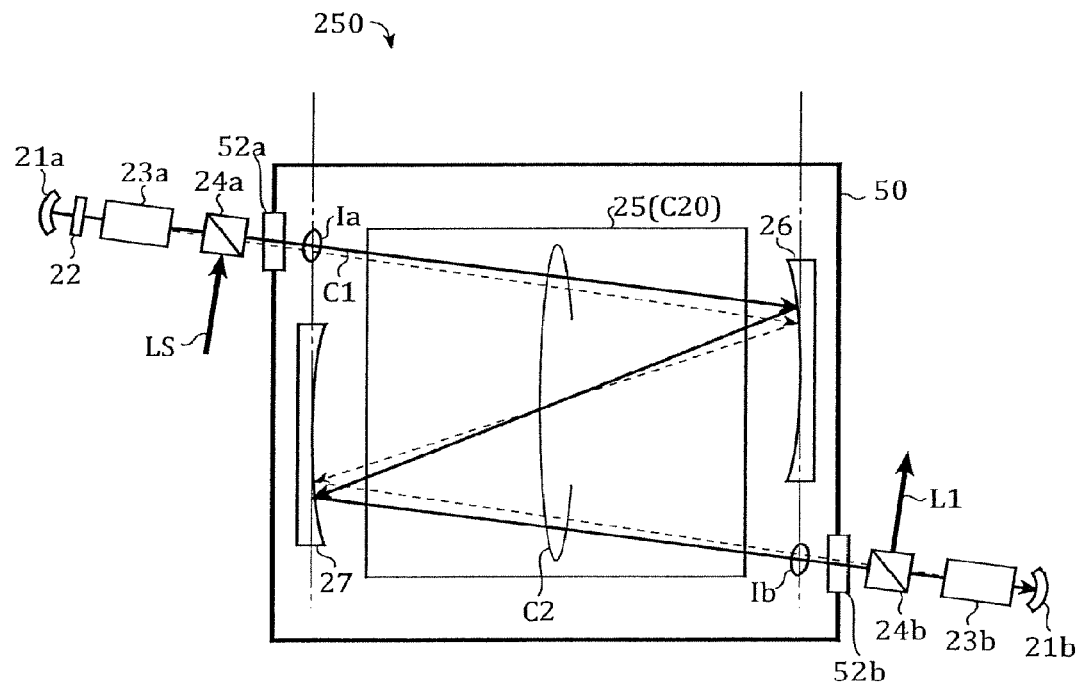
FIG. 17 is a schematic top view of a slab type regenerative amplifier according to a fifth embodiment of this disclosure, in which $CO_2$ laser gas is used as a gain medium.
Figure 18:
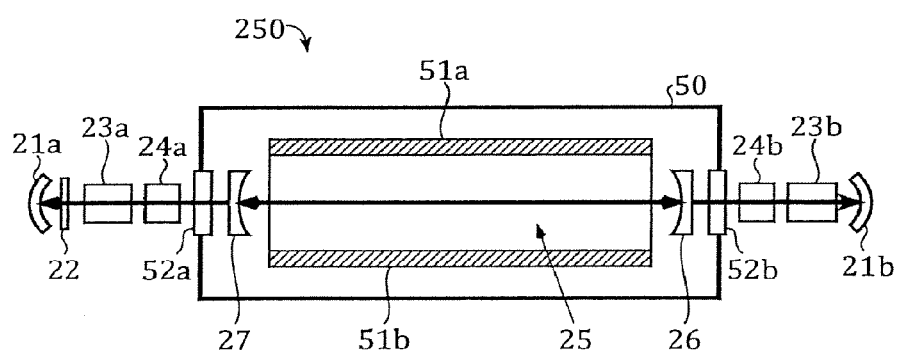
FIG. 18 is a schematic side view of the regenerative amplifier illustrated in FIG. 17.

FIGS. 17 and 18 illustrate a fifth embodiment in which a slab $CO_2$ laser is applied to a regenerative amplifier. FIG. 17 is a schematic top view of a slab regenerative amplifier 250 of the fifth embodiment, which may include $CO_2$ laser gas as a gain medium. FIG. 18 is a schematic side view of the regenerative amplifier 250 illustrated in FIG. 17. In the fifth embodiment, a slab $CO_2$ laser may be applied to the regenerative amplifier 20 of FIG. 3. As is apparent from the comparison of FIGS. 17 and 18 and FIG. 3, the regenerative amplifier 250 of the fifth embodiment may include a $CO_2$ laser gas chamber 50, windows 52a and 52b, and discharge electrodes 51a and 51b, in addition to the components illustrated in FIG. 3. The discharge electrodes 51a and 51b and concave HR mirrors 26 and 27 may be disposed in the $CO_2$ laser gas chamber 50. The windows 52a and 52b may transmit a laser beam into the $CO_2$ laser gas chamber 50 while airtightly sealing the $CO_2$ laser gas chamber 50. High-frequency voltage may be applied between the discharge electrodes 51a and 51b, whereby an electric discharge may occur therebetween. The discharge area may serve as an amplification region. Operation of the regenerative amplifier 250 is similar to that of the regenerative amplifier 20 illustrated in FIG. 3.

While one pre-amplifier PA and one main amplifier MA are adopted in the above-described embodiments, this disclosure is not limited thereto, and a plurality of pre-amplifiers PA and a plurality of main amplifiers MA may be disposed in series.

In the above description, the spherical-concave mirrors, a combination of the lenses and the flat mirrors, or the like have been used as the concave HR mirrors 26 and 27 so that the optical image (incident optical image Ia) on the input side of the multipass along which the pulsed laser beam may be reciprocated inside the slab amplifier 25 may simply be transferred as the optical image (transfer optical image Ib) on the output side of the multipass. This disclosure, however, is not limited thereto. The optical system may be variously modified as long as the optical system allows the optical image (incident optical image Ia) on the input side of the multipass along which the pulsed laser beam in reciprocated may simply be transferred as the optical image (transfer optical image Ib) on the output side of the multipass. For example, a combination of a concave mirror and a convex mirror, a combination of a convex lens and a concave mirror, a combination of a concave lens and a convex mirror, and for forth may be adopted.

In the above descriptions, as a specific example of the multipass amplification, the pulsed laser beam may zigzag through the amplification region. This arrangement allows the pulsed laser beam to be amplified efficiently.

The above-described embodiments and the modifications thereof are merely exemplary embodiments and modifications of this disclosure. This disclosure is not limited to these embodiments and modifications, and can be variously modified according to the specifications or the like. Further, it is obvious from the above description that other various embodiments can be made within the scope of the disclosure. In addition, the above embodiments and modifications can be combined as desired.

The invention claimed is:

1. A regenerative amplifier used in combination with a laser device, the regenerative amplifier comprising:
a slab amplifier provided between the pair of the resonator mirrors for amplifying a laser beam with a predetermined wavelength outputted from the laser device;
a first optical system disposed to configure a multipass optical path along which the laser beam is reciprocated inside the amplifier, the first optical system transferring an optical image of the laser beam at a first position on a light of the laser beam including the multipass optical path as an optical image of the laser beam at a second position on the optical path and transferring the optical image of the laser beam at the second position as the optical image of the laser beam at the first position;
a second optical system located at one end of the optical path; and
a third optical system located at the other end of the optical path, wherein
the first position is positioned between the second optical system and the slab amplifier,
the second position is positioned between the third optical system and the slab amplifier,
the second optical system transfers the optical image of the laser beam at the first position as the optical image of the laser beam at the first position, and
the third optical system transfers the optical image of the laser beam at the second position as the optical image of the laser beam at the second position.

2. The regenerative amplifier according to claim 1, wherein the first optical system includes:
a pair of mirrors; and
a reflective surface of at least one of the pair of the mirrors is spherical-concave.

3. The regenerative amplifier according to claim 1, wherein the first optical system includes:
a pair of mirrors; and
a reflective surface of at least one of the mirrors is flat.

4. The regenerative amplifier according to claim 3, wherein the first optical system further includes a spherical lens disposed to face the reflective surface of the at least one of the mirrors.

5. A laser apparatus comprising:
at least one semiconductor laser configured to oscillate a laser beam with a predetermined wavelength; and
the regenerative amplifier according to claim 1, the regenerative amplifier amplifying the laser beam outputted form the at leas one semiconductor laser.

6. The laser apparatus according to claim 5, further comprising a current control unit for controlling a current waveform to be inputted into the at least one semiconductor laser.

7. The laser apparatus according to claim 5, wherein the semiconductor laser is a quantum cascade laser.

8. The laser apparatus according to claim 5, wherein the semiconductor laser oscillates in either a single-longitudinal mode a multi-longitudinal mode.

9. The laser apparatus according to claim 5, further comprising at least one amplifier for amplifying the laser beam outputted from the regenerative amplifier.

10. The laser apparatus according to claim 9, wherein at least one of the at least one amplifier contains $CO_2$ gas.

11. An extreme ultraviolet light generation system comprising:
at least one semiconductor laser configured to oscillate a laser beam with a predetermined wavelength;
a regenerative amplifier according to claim 1, the regenerate amplifier amplifying the laser beam outputted from the at least one semiconductor laser;
at least one amplifier configured to amplify the laser beam outputted from the regenerative amplifier;
a chamber provided with an input port through which the laser beam outputted from the at least one amplifier enters the chamber;
a target supply unit provided to the chamber for supplying, to a predetermined region inside the chamber, a target substance serving as a plasma source;
a focusing mirror configured to focus the laser beam amplified by the at least one amplifier at a point in the predetermined region in the chamber through the input port; and
a collector mirror provided in the chamber for collecting the extreme ultraviolet light emitted from the plasma generated in the predetermined region.

12. The regenerative amplifier according to claim 1, wherein the second and third optical systems include a pair of resonator mirrors consisting an optical resonator.

13. The regenerative amplifier according to claim 1, wherein the slab amplifier contains $CO_2$ gas.

* * * * *